United States Patent [19]

Itoh et al.

[11] Patent Number: 5,237,368
[45] Date of Patent: Aug. 17, 1993

[54] METHOD AND APPARATUS FOR FORMING AN IMAGE WITH A REVERSIBLE THERMOSENSITIVE MEDIUM

[75] Inventors: Shinichi Itoh; Kenzo Tsuji, both of Tokyo, Japan

[73] Assignee: Oki Electric Industry Co., Ltd., Tokyo, Japan

[21] Appl. No.: 513,488

[22] Filed: Apr. 23, 1990

[30] Foreign Application Priority Data

Apr. 25, 1989 [JP] Japan ................................. 1-103427
Sep. 29, 1989 [JP] Japan ................................. 1-251760

[51] Int. Cl.⁵ .......................................... G03G 21/00
[52] U.S. Cl. ............................... 355/202; 346/76 PH; 346/153.1; 355/212; 355/274
[58] Field of Search ............... 355/200, 202, 245, 211, 355/212, 213, 274, 275, 282; 346/76 R, 76 PH, 76 L, 151, 153.1, 157, 160.1

[56] References Cited

U.S. PATENT DOCUMENTS

| | | | |
|---|---|---|---|
| 3,937,572 | 2/1976 | Goynor et al. | 355/217 |
| 4,675,699 | 6/1987 | Kan et al. | 350/351 X |
| 4,752,800 | 6/1988 | Matui | 355/202 |
| 4,766,403 | 8/1988 | Sasaki et al. | 355/212 |

FOREIGN PATENT DOCUMENTS

| | | |
|---|---|---|
| 0322903 | 7/1989 | European Pat. Off. . |
| 2154491 | 5/1972 | Fed. Rep. of Germany . |
| 3342579 | 5/1984 | Fed. Rep. of Germany . |
| 179884 | 10/1983 | Japan . |
| 219573 | 12/1983 | Japan . |
| 138871 | 6/1987 | Japan . |
| 0181166 | 7/1990 | Japan ........................ 355/212 |
| WO85/04027 | 9/1985 | PCT Int'l Appl. . |

OTHER PUBLICATIONS

Patent Abstracts of Japan, vol. 6, No. 212 (Japanese 57-118253; Jul. 23, 1982).
"Display System sing Reversible Heat-Sensitive Material" Nakaya et al. Proceedings of SID, vol. 22/1, 1981, pp. 23-27.
"Display Device Using Thermotropically Reversible Material" Saito et al. Technical Paper of the Institute of Electronics and Communication Engineers of Japan, vol. 80, No. 123, IE 80-61 to 62, Sep. 24, 1980, pp. 1-8.
"Reversible Thermosensitive Material and Printing Characteristics" Hotta et al. Proceedings of 4th Japanese Symposium on Non-Impact Printing Technologies Symposium, Jul. 23-24, 1987 pp. 57-60.

Primary Examiner—Leo P. Picard
Assistant Examiner—Christopher Horgan
Attorney, Agent, or Firm—Spencer, Frank & Schneider

[57] ABSTRACT

In image formation, a reversible thermosensitive medium, preferably in the form of an endless belt, is selectively heated in accordance with an electrical image signal, so that the areas of the thermosensitive belt will have different transmittances corresponding to the respective pixels of the image signal. A photosensitive member, preferably in the form of a drum, widely employed in electrophotography, is uniformly charged, and the thermosensitive belt is then superimposed on the photosensitive drum, and the photosensitive drum is exposed to light of a uniform intensity through the thermosensitive belt. The intensity of light which each area of the photosensitive drum receives depends of the transmittance of the corresponding area of the thermosensitive belt. An electrostatic image that is formed on the photosensitive drum as a result of the exposure is therefore a conversion from the transmittance image on the thermosensitive belt. A toner image may then be developed and transferred and fixed on recording paper.

14 Claims, 10 Drawing Sheets

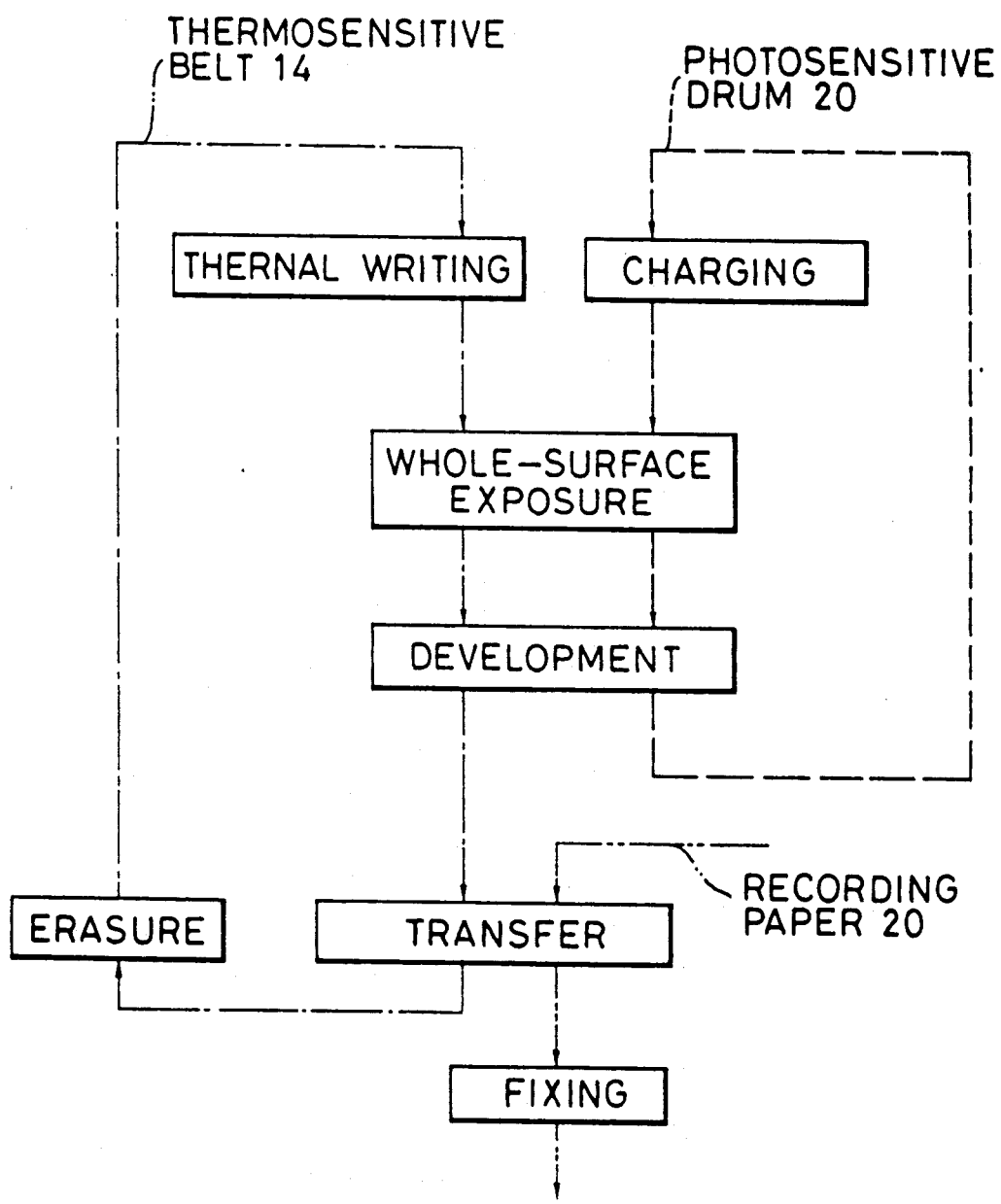

FIG.9A
FIG.9B
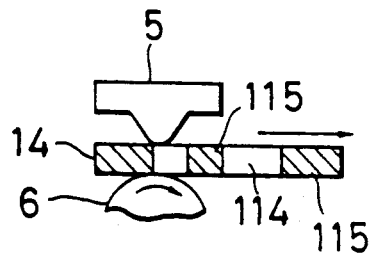
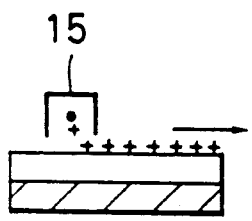
FIG.9C
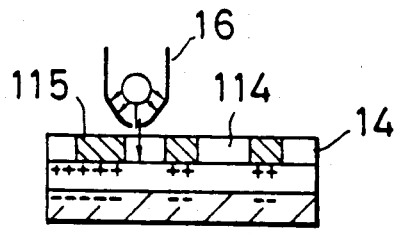
FIG.9D
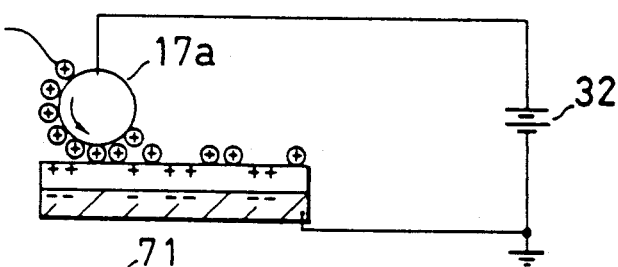
FIG.9E
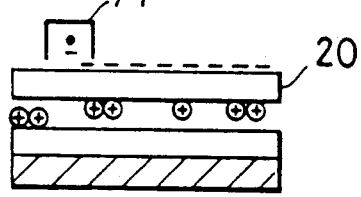
FIG.9G
FIG.9F
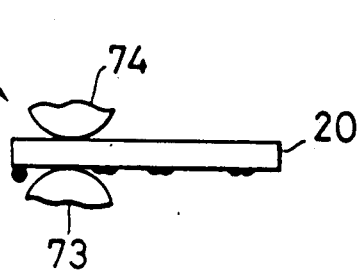
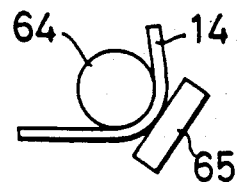

METHOD AND APPARATUS FOR FORMING AN IMAGE WITH A REVERSIBLE THERMOSENSITIVE MEDIUM

BACKGROUND OF THE INVENTION

This invention relates to a method of and apparatus for forming an image using a reversible thermosensitive medium. More specifically, the invention relates to image formation using a thermosensitive medium in combination with a photosensitive member.

Conventionally, recording methods using heat-emitting recording elements have been widely used in telecopiers and printers because the heat-emitting recording elements were low cost and the process was simple. In such devices, the image was written directly on thermosensitive paper.

The recording paper used in this method, however is a special paper which changes its color due to the action of heat, and it therefore has poor conservation properties.

To improve this situation, a thermal transfer method has been proposed wherein an ink-coated film is used as an intermediate medium, the ink on the film is melted by the heat-emitting elements, and the melted ink is then transferred to paper. This method has been widely used in printers (see Japanese Patent Application Publication No. 61-030791, and "Proceedings of the 4th NIP Technical Symposium", Electrophotography Institute (Jul. 23, 1987)).

In the above arrangement, however, if the recording paper does not have a smooth surface, the ink cannot be completely transferred. Consequently, ordinary paper cannot be used to record images using heat-emitting recording elements.

An electrophotographic method has been proposed in order to record on ordinary paper. If this is applied to printers, however, a laser and image-forming optical system, or an LED (light-emitting diode) array and image-forming system must be used as the exposure means, and the cost of the equipment is thereby increased.

SUMMARY OF THE INVENTION

Accordingly, an object of the invention is to provide a low-cost image-forming method and image-forming device which solves the problems inherent in conventional equipment, and permits the recording to be made on ordinary paper.

According to the invention, an electrostatic image is formed on a photosensitive member by:

selectively applying heat to a reversible thermosensitive medium to form a transmittance image represented by different transmittances;

uniformly charging a photosensitive member;

superimposing said thermosensitive medium on which the image has been formed, with said photosensitive member which has been uniformly charged; and performing a whole-surface exposure on said photosensitive member through said thermosensitive medium as superimposed with said photosensitive member.

Furthermore, a printed image can be formed on a recording medium such as ordinary recording paper by the additional steps of:

developing a toner image on the photosensitive member or on the thermosensitive medium;

transferring the toner image to the recording paper; and fixing the toner image on the recording paper.

The reversible thermosensitive medium may have such hysteresis characteristics between temperature and transmittance that it assumes a first state when it is cooled to a first temperature after being heated to a second temperature higher than said first temperature, and assumes a second state when it is cooled to said first temperature after being heated a third temperature higher than said first temperature and lower than said second temperature. In this case, it is preferable that areas of the thermosensitive medium are selectively heated to said third temperature, and after the exposure the thermosensitive medium is heated to said second temperature to erase the transmittance image.

When the development of the toner image is made on the thermosensitive medium, the transfer of the toner image to the recording paper, the fixing of the toner image on the recording paper and the erasure of the transmittance image on the thermosensitive medium may be achieved at the same location, by a combination of a heating roller and a pressure roller holding the thermosensitive medium and the recording paper between them.

BRIEF DESCRIPTION OF THE DRAWINGS

FIG. 7 shows the sequence of operations for each component in the Embodiment 2.

FIG. 9A to FIG. 9G show the image-forming process of the Embodiment 3.

DETAILED DESCRIPTION OF THE PREFERRED EMBODIMENTS

The invention is featured by the combination of use of the reversible thermosensitive medium for conversion of electrical signals into a transmittance image on the thermosensitive medium, and the use of a photosensitive member for conversion of the transmittance image into an electrostatic image on the photosensitive member.

The photosensitive member may be in the form of a drum which is widely employed in Carlson's electrophotography, which is well known, but is briefly described below.

Carlson's electrophotography uses a drum having a photosensitive surface which passes a charging section where the photosensitive surface is uniformly charged, an exposure section where the photosensitive surface is exposed to a light image or a pattern of light to form an electrostatic latent image consisting of charged areas and discharged areas, a developing section where toner is attracted to the charged areas of the latent image so that a toner image is developed, a transfer section where the toner image is transferred to a recording paper which has been brought into contact with the photosensitive drum, and a cleaning section which removes any residual toner on the photosensitive surface. The toner image that has been transferred to the recording paper is fixed by application of heat, for example, and the recording paper is then discharged from the apparatus.

Examples of conventional electrophotography arrangements are shown in U.S. Pat. No. 2,297,691, and "Fundamentals and Applications of Electrophotography," page 28, and pages 303 to 304, Edited by The Society of Electrophotography of Japan, Published by Corona K. K., Jun. 15, 1988.

A reversible thermosensitive medium which also forms the crux of the invention will now be described.

The reversible thermosensitive medium consists of a substrate coated with a thermochromic material. Recording on a thermochromic material can be made by utilizing its capacity to change transmittance depending on temperature variation.

Figure 1:
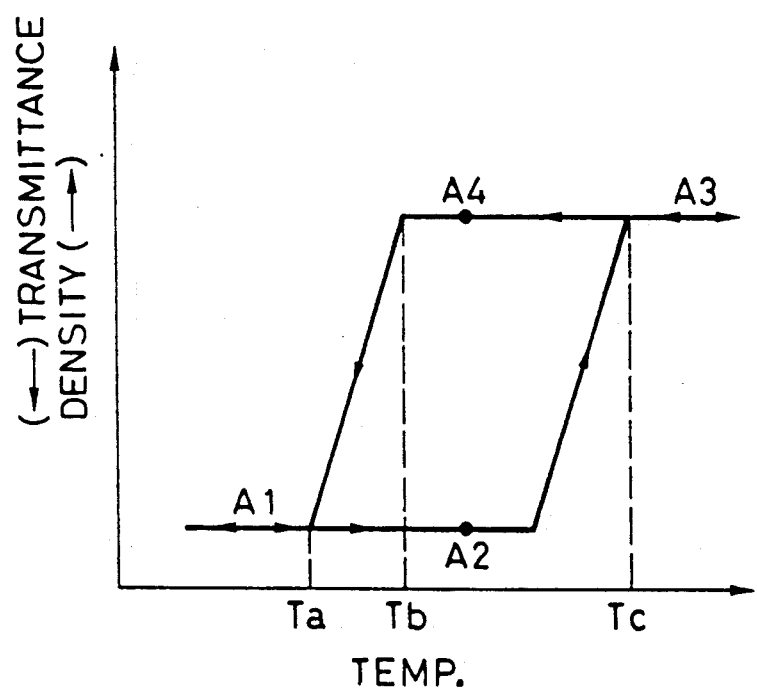
FIG. 1 is a diagram showing the relation between temperature and density of a reversible thermosensitive medium of a first type, Type A.

FIG. 1 is a diagram of the relation between temperature and color density of a reversible thermosensitive medium of a first type, which is hereinafter called Type A.

The reversible thermosensitive medium of Type A shows a change of color density depending on temperature, and this change is reversible. There is hysteresis in the variation of temperature and color density, and the state of the material varies in the order A1, A2, A3 and A4 with the rise and fall of temperature. When writing an image, the areas of the thermosensitive medium on which dots or pixels of one color (e.g., black) should be formed are heated from an initial state A1 to a temperature above Tc. Thereafter, until the temperature is lowered to Tb, the thermosensitive medium maintains the state A4, and the color density remains to different from the areas where pixels of another color (white, or background) are to be formed. If the reversible thermosensitive medium is then cooled below a temperature Ta, the image is erased. An example of thermosensitive material of the type A is shown in Proceedings of SID, Vol. 22/1, 1981, pp. 223 to 27, "Display System Using Reversible Heat-Sensitive Material" by Nakaya, et al. With this material, the temperatures Ta, Tb, and Tc are respectively, 20° C., 40° C., and 55° C. Another publication showing an example of such thermosensitive material is Technical Paper of the Institute of Electronics and Communication Engineers of Japan, Vol. 80, No. 123, IE 80-61 to 62 (Sep. 24, 1980), pp. 1 to 8, "Display Device Using Thermotropically Reversible Material," Saito et al. These publications are incorporated herein by reference.

Figure 2:
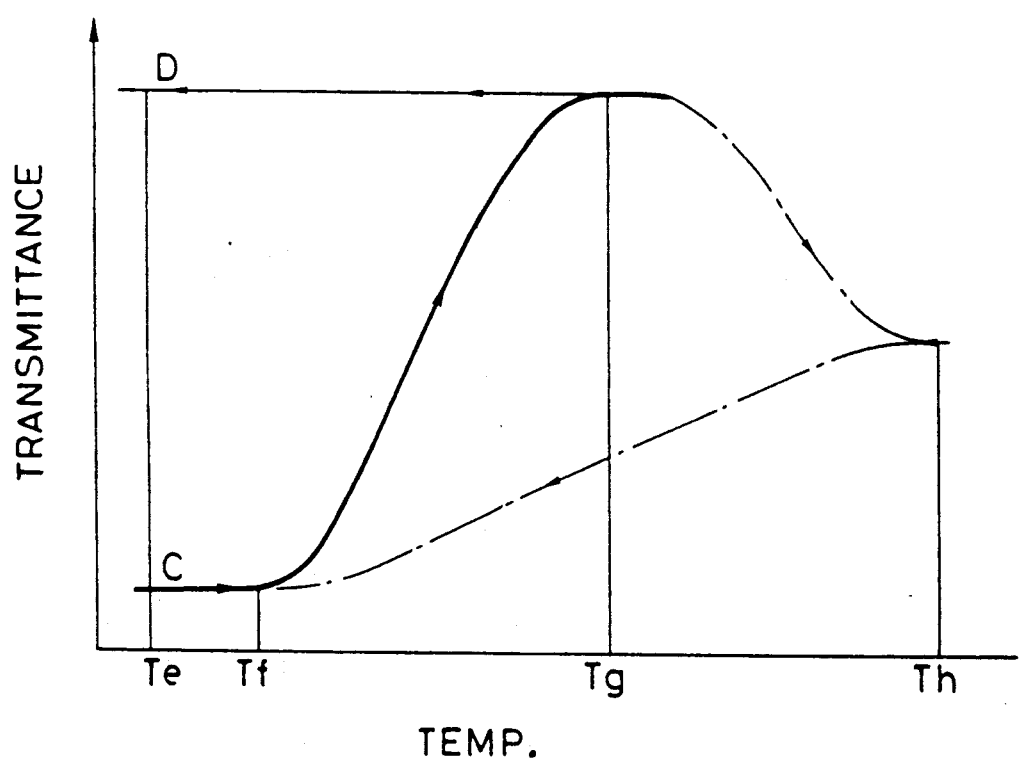
FIG. 2 is a diagram showing the relation between temperature and transmittance of a reversible thermosensitive medium of a second type, Type B.

FIG. 2 is a diagram showing the relation between temperature and transmittance for a reversible thermosensitive medium of a second type, which is hereinafter called Type B.

The thermosensitive medium of Type B is characterized by the fact that such media change between a transparent state and a translucent state, and these two states can be maintained even at room temperature. Assume that this thermosensitive medium is first in the translucent state C at room temperature Te. When the thermosensitive medium is heated, the transmittance begins to increase at temperature Tf, and reaches its maximum at a temperature Tg. When the thermosensitive medium is then cooled to room temperature, it follows along the solid line and reaches the state D where it maintains the transparent state D.

Next, if this transparent reversible thermosensitive medium is heated to a temperature above Th, it reaches an intermediate state between transparent state D and translucent state C. If the thermosensitive medium is then cooled to room temperature Te, it follows along the chain line, and reaches the original translucent state C.

Let image-writing begin at state C. The areas of the thermosensitive medium on which pixels of one color (e.g., black) of the image are to be formed are heated to the temperature Tg. When the thermosensitive medium returns to room temperature, the areas heated to Tg assume the state D, and a difference of transmittance is thus produced between the heated areas and the non-heated areas. Further, if the thermosensitive medium is heated to a temperature above Th, it can be returned to the original translucent state C. An example of thermosensitive material of the type B is shown in Proceedings of 4th Japanese Symposium of Non-Impact Printing Technologies Symposium, on Jul. 23 and 24, 1987, pp. 57 to 60, "Reversible Thermosensitive Material and Printing Characteristics", Hotta, et al. With this material, the temperatures Te, Tf, Tg and Th are respectively 20° C., 50° C., 60° C. and 72° C. This publication is also incorporated herein by reference.

Embodiments of the invention will now be described.

EMBODIMENT 1

A first embodiment of this invention will now be described with reference to FIG. 3 to FIG. 5.

Figure 3:
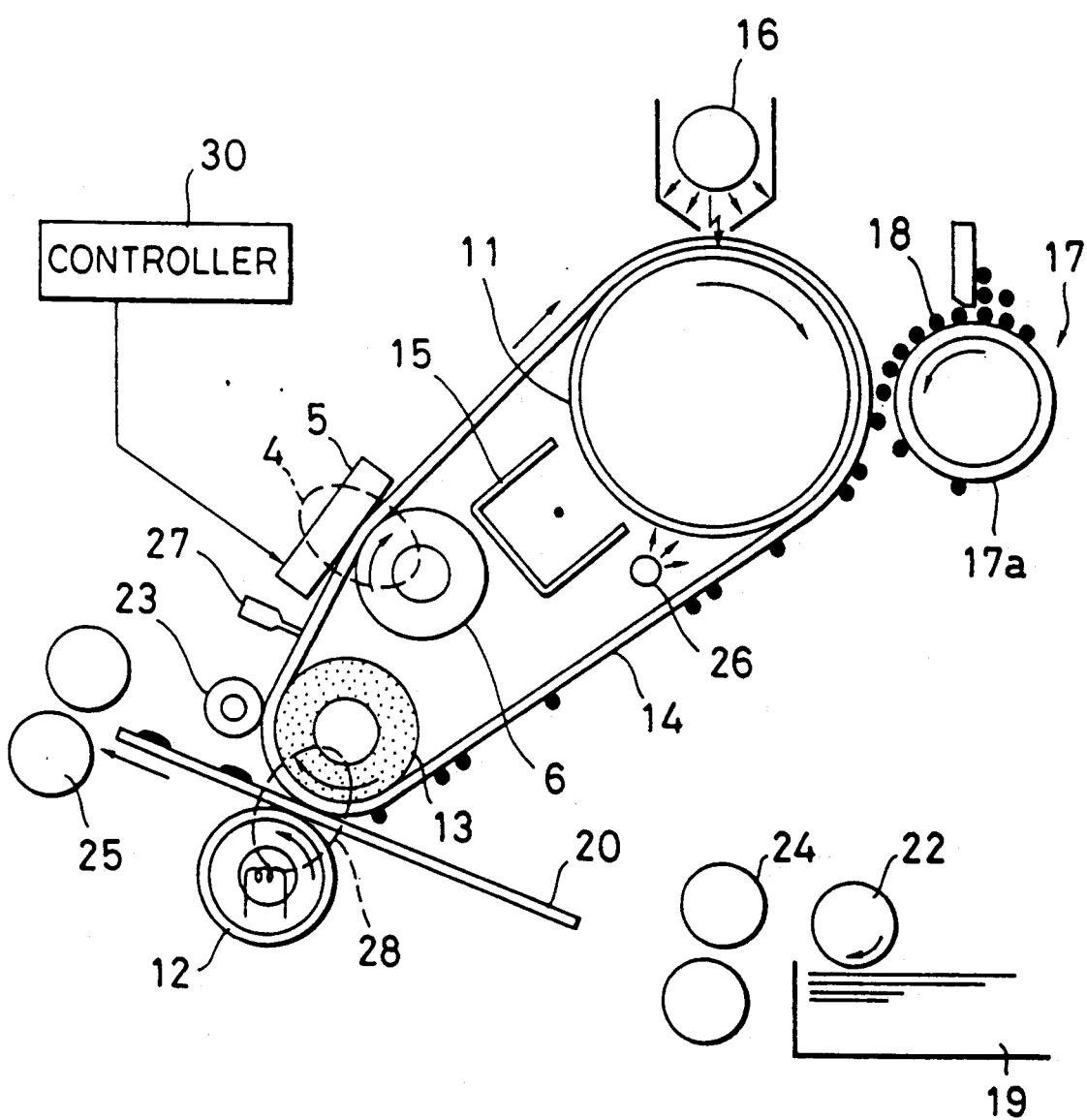
FIG. 3 is a schematic diagram of the image-forming apparatus of an Embodiment 1.

The illustrated image-forming apparatus shown in FIG. 3 comprises a photosensitive member in the form of a photosensitive drum 11 rotatably mounted on a frame, not shown. The photosensitive drum 11 has a photosensitive layer on an electrically conducting support. Suitable materials for the photosensitive layer are selenium photosensitive material, and an organic photosensitive material.

The image-forming apparatus also comprises a heating roller 12 and a pressure roller 13 which are pressed against each other by a means not shown. The heating roller 12 may be of a hollow metal member enclosing a halogen lamp, or one having a heat-emitting body disposed directly on a metal surface.

An endless thermosensitive medium of Type B, in the form of a belt 14, is passed around the photosensitive drum 11 and the pressure roller 13. More particularly, the thermosensitive belt 14 is in contact, on a first or inner surface thereof, with the peripheral surface of the photosensitive drum 11 over a portion of the photosensitive drum arc, and as the photosensitive drum 11 rotates, the thermosensitive belt 14 moves together with the photosensitive drum 11. Where the thermosensitive belt 14 passes around the pressure roller 13, it passes between the heating roller 12 and the pressure roller 13. The location where the heating roller 12 confronts the pressure roller 13 forms an integrated transfer-fixing-erasure section (TFE section) 28.

As the photosensitive drum 11 rotates its surface sequentially passes various processing sections or devices, namely a charging device 15, an exposure device 16, a developing device 17, and a discharge lamp 26. The exposure device 16 and the developing device 17 face the photosensitive drum, not directly, but through the thermosensitive belt 14. Between the location where the charging device 15 confronts the photosensitive drum 11 and the location where the exposing device 16 confronts the photosensitive drum 11, the thermosensitive belt 14 is brought into contact with the photosensitive drum 11. Between the location where the developing device 17 confronts the photosensitive drum 11 and the location where the discharging lamp 26 confronts the photosensitive drum 11, the thermosensitive belt 14 is separated from the photosensitive drum 11.

Before being brought into contact with the photosensitive drum 11, the thermosensitive belt 14 passes through a thermal writing section 4, which comprises a thermal head 5 and a platen roller 6. The thermosensitive belt 14 is held between the thermal head 5 and the platen roller 6. After being separated from the photosensitive drum 11, the thermosensitive belt 14 passes the TFE section 28, a cleaning device 23, and a discharge brush 27.

The thermal head 5 comprises a row of heat-emitting elements which are disposed to produce pixels of a transmittance image on the thermosensitive medium, and are driven selectively in accordance with electrical signals representing the image to be formed. When the heat-emitting elements are driven, they heat the areas for the corresponding pixels to the temperature Tg. When the heat-emitting elements not driven, the areas corresponding to the respective pixels are kept below Tf.

The electrical signals representing the image are supplied from a controller 30 which also performs the overall control of the apparatus.

The areas or dots of the thermosensitive belt 14 that have been heated to the temperature Tg have a high transmittance, while the areas or dots of the thermosensitive belt 14 that are kept below Tf have a low transmittance. This does not mean that each area can assume only one or the other of two distinct states a transparent state or a translucent state with a certain fixed transmittance since there can be intermediate states and the transmittance of each area is dependent on the density of the corresponding area of the image. However it will be assumed during the following description that the image consists of the two states, for simplicity of explanation and illustration.

The charging device 15 is a corona discharge device for providing an electrostatic charge uniformly over the entire width of the photosensitive surface of the photosensitive drum 11. The charging device 15 may alternatively be formed of a brush charging device.

The exposure device 16 exposes the photosensitive drum 11 through the thermosensitive belt, while the transmittance image on the thermosensitive medium is still maintained either because of the hysteresis characteristics or because the erasure takes place before the heated parts of the thermosensitive medium have not cooled substantially.

The exposure device 16 is a light source, such as a fluorescent lamp, or a halogen lamp, a row of LEDs (light-emitting diodes), for illuminating the thermosensitive belt 14 with a uniform intensity over the entire width of the thermosensitive belt 14. Because the transmittance of the thermosensitive belt 14 has been modulated according to the image, the amount of light reaching the surface of the photosensitive drum 11 is modulated and hence an electrostatic latent image is formed on the photosensitive surface of the photosensitive drum 11. The areas or dots of the photosensitive surface which have been irradiated by light are discharged, while the areas or dots of the photosensitive drum which have not been irradiated are kept charged. Although there can be intermediate states and each area is discharged to a degree which is dependent on the transmittance of the corresponding area of the transmittance image, during the following description it will be assumed that the latent image consists of charged areas and discharged areas, for simplicity of explanation and illustration.

The developing device 17 is installed facing the outer surface of the thermosensitive belt 14, which is moving in intimate contact with the photosensitive drum 11, as described above. The developing device is provided with a developing agent support in the form of a roller 17a, to which toner 18 is attached. The toner 18 is transported so as to develop a toner image on the outer surface of the thermosensitive belt 14. The developing device may be a two-component magnetic brush developer, a one-component magnetic brush developer, or a one-component non-magnetic developer.

The TFE section 28 applies heat and pressure on the thermosensitive belt 14 and recording paper 20, which is supplied in a manner described later, to transfer the toner image onto the recording paper 20, to fix the toner image on the recording paper 20, and to erase the transmittance image on the thermosensitive belt 14.

The discharge lamp 26 faces the part of the photosensitive drum 11 which has just separated from the thermosensitive belt 14 after developing. The function of the discharge lamp 26 is to irradiate the photosensitive drum through its entire width to dissipate all the charges on it, thereby making it ready for the next cycle of operations.

As described earlier, after passing through the TFE section 28, the thermosensitive belt 14 also passes the cleaning device 23 and then the discharge brush 27.

The cleaning device 23 is mounted opposite the pressure roller 13, but after the TFE section 28. The function of the cleaning device 23 is to remove any residual toner from the thermosensitive belt 14.

The discharge brush 27 is mounted in contact with the thermosensitive belt 14. The function of the discharge brush 27 is to remove any residual electrostatic charge from the thermosensitive belt 14.

The paper feed system for the recording paper 20 is comprised of a paper feed cassette 19, a paper pick-up roller 22, a paper advance roller 24, and a paper eject roller 25. Their operation is controlled by the controller 30.

The photosensitive drum 11 and the heating roller 12 are rotated at a constant peripheral speed in the direction shown by the arrow in the figure by a drive mechanism, not shown. As a result, due to the friction of the photosensitive drum 11 and the heating roller 12, the thermosensitive belt 14 is moved in the direction shown by the arrow.

The image-forming process will now be described with reference to FIG. 4A to FIG. 4E.

Figure 4A:
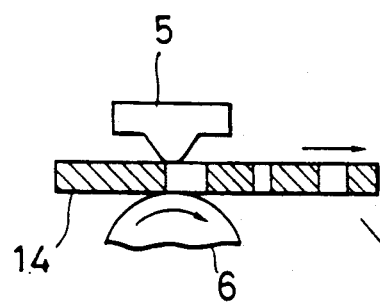
FIG. 4A to FIG. 4E show the image-forming process of the Embodiment 1.
Figure 4B:
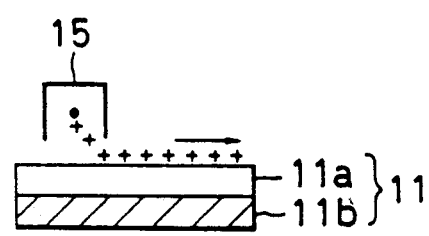
Figure 4C:
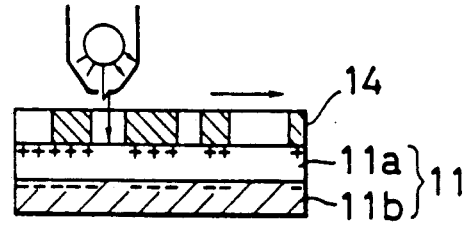
Figure 4D:
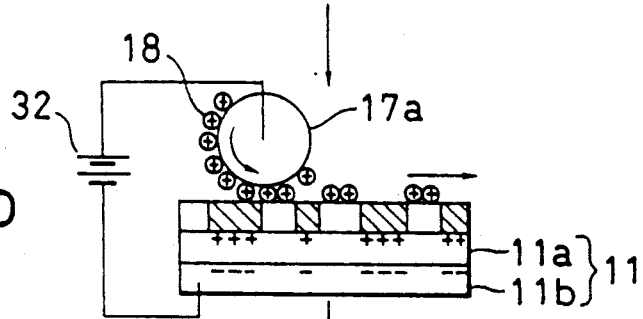
Figure 4E:
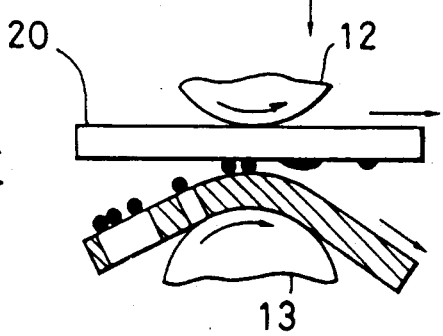
Figure 5:
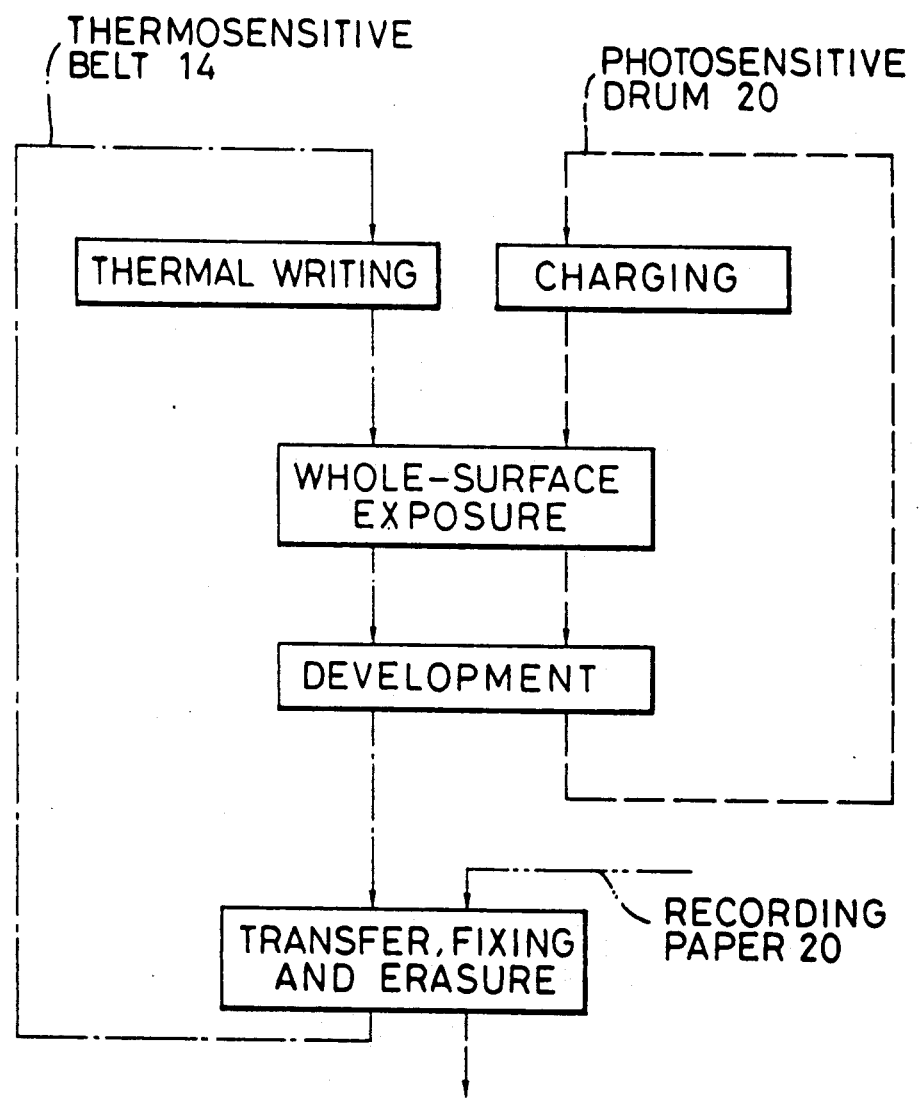
FIG. 5 shows the sequence of operations for each component in the Embodiment 1.

FIG. 4A shows the thermal writing step, FIG. 4B shows the charging step, FIG. 4C shows the exposure step, FIG. 4D shows the development step, and FIG. 4E shows the transfer and fixing step.

The reversible thermosensitive belt 14 is initially at the translucent state C (FIG. 2). In the thermal writing step shown in FIG. 4A, transmittance image is written on the thermosensitive belt 14 by selective heating in accordance with electrical image signals. The resultant transmittance image has transmittances for the respective pixels corresponding to the electrical image signals. The areas or dots heated to a high temperature to turn them transparent are shown unhatched in FIG. 4A, whereas the areas or dots 115 that have not been heated and remain translucent are shown hatched in FIG. 4A.

In the charging step shown in FIG. 4B, the surface of the photosensitive drum 11 is directly charged uniformly by the corona discharge device 15. The photosensitive drum 11 is formed of a photosensitive layer 11a coated on an electrically conductive support 11b. In the illustrated example, a positive type photosensitive member is used, and positive charges are shown to be accumulated on the surface, as a high voltage is applied to the corona discharge device 15.

In the exposure process shown in FIG. 4C, light from the exposure device 16 passes through thermosensitive belt 14 and is irradiated onto the photosensitive drum 11 to form an electrostatic latent image on the photosensitive layer 11a of the photosensitive drum 11. The amount of light irradiating each area or dot of the photosensitive layer 11a of the photosensitive drum 11 corresponds to the transmittance of the corresponding area or dot of the transmittance image of the thermosensitive belt 14. Simply stated, the electrostatic image consists of charged areas which have not been irradiated, and discharged areas which have been irradiated.

In the developing step shown in FIG. 4D, reversal development is used, and a means 32 of applying a bias potential is connected across the electrically conducting support 11b of photosensitive drum 11 and the toner support 17a, to apply the bias potential. As a result, the discharged areas of the latent image on the photosensitive drum 11 attract the positively charged toner 18, and the attracted toner 18 is attached to the outer surface of the thermosensitive belt 14 directly over the discharged areas. More specifically, electric lines of force are generated between the toner support 17a and the discharged areas of the latent image on the photosensitive drum 11, passing through the thermosensitive belt 14. The particles of the toner 18 travel along these electric lines of force and adhere to the outer surface of the thermosensitive belt 14, and are kept adhering there by a relatively weak electrostatic force.

Finally, the toner image on the thermosensitive belt 14 is moved past the TFE section 28 in FIG. 4E. In synchronism with the toner image on the thermosensitive belt 14, the recording paper 20 is fed to the TFE section 28. More specifically, the recording paper is the supplied from the paper supply cassette 19, being picked up by the pick-up roller 22, and is advanced by the paper advance roller 24, such that the leading edge of the recording paper (to be precise, the leading edge of the area in which the image is to be reproduced) arrives at the TFE section 28 simultaneously with, and hence comes into contact with, the leading edge of the area of the thermosensitive belt 14 in which the toner image is formed. The thermosensitive belt 14 and the recording paper 20 are moved at the same speed.

Simultaneously with the transfer and fixing, the thermosensitive belt 14 is heated to a temperature above Th so that it reaches the state D and then resumes the original state C when it thereafter cools. In this way, all the pixels along the entire width of the thermosensitive belt 14 will resume the original translucent state C and be ready for the next cycle operations.

During the transfer and fixing, the recording paper 20 and the thermosensitive belt 14 are held between the pressure roller 13 and the heating roller 12. The toner image on the thermosensitive belt 14 is therefore melted by the heat of the heating roller 13, whereupon the pressure causes melted toner 18 to permeate the fibers of the recording paper 20. This transfers and fixes the toner image so as to reproduce a toner image (printed image) on the recording paper 20.

The recording paper 20 is thereafter discharged or ejected by means of the eject roller 25, out of the housing of the apparatus, onto a stacker, not shown, for example.

After the transfer onto the recording paper 20 is completed, a small amount of toner 18 may remain on the thermosensitive belt 14. However this is wiped off by bringing the cleaning device 23 into pressure-contact with the thermosensitive belt 14 against the roller 13. Further, the discharge brush 27 is also arranged in contact with the thermosensitive belt 14 to remove static electricity which may be present on the thermosensitive belt 14. In this way, the thermosensitive belt 14 is cleaned and electrically discharged, and may thus be used again.

The above described steps repeatedly take place in sequence. In addition, while some involving the steps of the photosensitive drum 11 are taking place, other steps involving the thermosensitive belt 14 are taking place. Some of the steps are common to the photosensitive drum 11 and thermosensitive belt 14. Such sequence of operations in regard to each component is illustrated in FIG. 5, in which the dotted line indicates the sequence of the steps followed by the photosensitive drum 11, the chain line indicates the sequence of the steps followed by the thermosensitive belt 14, and the phantom line indicates the sequence of the steps followed by the recording paper 20.

In the above-described transfer and fixing step, the thermosensitive belt 14 is heated by the heating roller 12 to reach a temperature of about 160° C. It must therefore be heat resistant. The thermosensitive belt 14 must therefore comprise a substrate which is sufficiently heat-resistant. Suitable materials include polyester, polyimide, polyetherimide, polyethersulfone and polyetheretherketone. Further, from consideration of the electric lines of force generated in the developing process, it is desirable that the thickness of the thermosensitive belt 14 be no greater than 200 $\mu$m; while from considerations of tensile strength and ease of handling, it is desirable that its thickness be no less than 10 $\mu$m.

The arrangement in which toner images are formed on the thermosensitive belt 14 rather than on the photosensitive drum 11 has the same advantages as the arrangement in which a belt is provided specifically for the development of toner images thereon as disclosed in earlier patent applications (U.S. patent application Ser. Nos. 07/470,169 and 07/469,938, both filed Jan. 25, 1990; European Patent Applications No. 90101614.7 and No. 90101612.1 both filed Jan. 26, 1990). Such advantages include reduction of the diameter of the photosensitive drum because of the reduction of the components that must be disposed around the drum, and the reduction of the friction and wear of the drum, and hence the possibility of using a less expensive photosensitive drum with a positive type organic photosensitive layer.

In the above embodiment, the toner 18 is a heat fixing toner, but a pressure fixing toner may be used instead. An example of pressure fixing toner is a microcapsule pressure fixing toner, which can be fixed with a minute pressure. In this case, the heating roller 12 may be omitted. In such a case, and if the thermosensitive medium has a hysteresis like than shown in FIG. 2, a separate erasing section, which may include a heating roller, must be provided along the path of thermosensitive medium, downstream of the transfer section, to erase the transmittance image on the thermosensitive medium.

Instead of the photosensitive drum 11, a photosensitive belt may be used. In this case, the thermosensitive belt 14 is made to pass by the photosensitive belt over a certain length, and the developing device is provided facing the thermosensitive belt passing 14 by the photosensitive belt.

The positions of the heating roller 12 and the pressure roller 13 may be interchanged such that the thermosensitive belt 14 is passed around the heating roller 12, rather than the pressure roller 13.

The recording paper 20 as used in the above embodiment may be replaced by any other form of recording medium.

In the above embodiment, a type B thermosensitive belt was used. But a type A thermosensitive belt may alternatively be used.

According to the embodiment described above, a transmittance image is first written on a reversible thermosensitive medium, which is then converted to an electrostatic image on a photosensitive drum. Low-cost heat-emitting elements can therefore be used for recording, and the apparatus can be offered at a low price. Further, printing can be made on ordinary paper, and there is no need for any special paper. Moreover, the efficiency of transfer from the thermosensitive belt to the recording paper is high. Furthermore, even if some toner remains on the thermosensitive medium after transfer, it can be wiped off easily. Still further, transfer and fixing can be carried out simultaneously by superimposing the developed thermosensitive belt and the recording paper. The transfer does not take place electrostatically, and the transfer can thus be performed even if an electrically conducting toner, which is easy to develop, is used. Moreover, as the toner image transferred to the recording paper is simultaneously fixed, the handling of the recording paper within the apparatus is facilitated because there is no state in which the toner image has just been transferred but has not been securely fixed. Furthermore, when the exposure step is combined with the transfer step and the fixing step, the device can be made more compact, and the cost can be reduced. In addition, as developing is carried out on the thermosensitive belt, the transfer efficiency is high, and even if some toner remains on the thermosensitive medium after transfer, it can be wiped off easily. There is therefore no need for the cleaning process used in conventional electrophotographic devices.

EMBODIMENT 2

Another embodiment of the invention will be described with reference to FIG. 6A to 6G. This embodiment is similar to Embodiment 1, but the transfer of the toner image to the recording paper 20, the fixing of the toner image on the recording paper 20, and the erasure of the transmittance image on the thermosensitive belt 14 are carried out separately: the toner image on the thermosensitive belt 14 is transferred onto the recording paper 20 first, and thereafter the toner image on the recording paper 20 is fixed, at a location separate from the location of the transfer, and the erasure of the transmittance image on the thermosensitive belt 14 is conducted at a location separate from the location of the transfer.

Figure 6A:
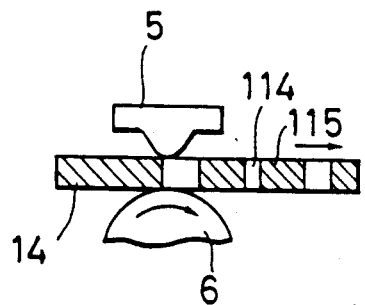
FIG. 6A to FIG. 6G show the image-forming process of an Embodiment 2.
Figure 6B:
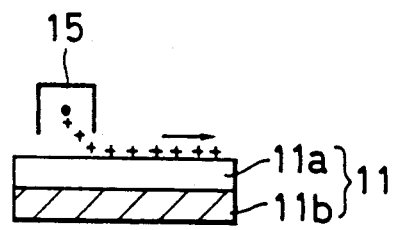
Figure 6C:
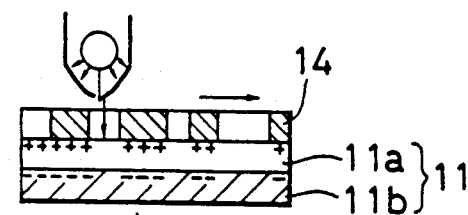
Figure 6D:
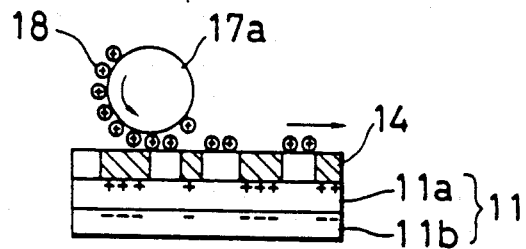
Figure 6E:
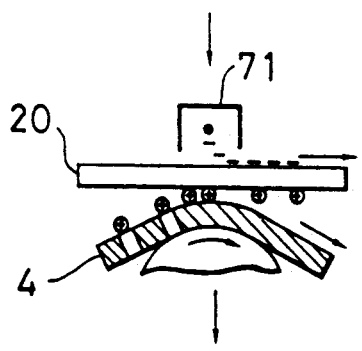
Figure 6F:
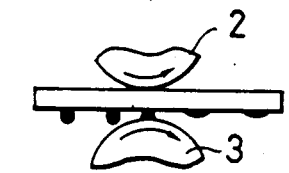
Figure 6G:
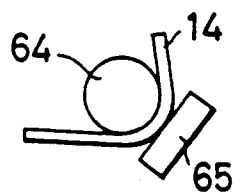

The operations at the respective steps are as shown in FIG. 6A to FIG. 6G, in which FIG. 6A to FIG. 6D respectively show the thermal writing step, the charging step, the exposure step, and the development step, which are similar to those shown in FIG. 4A to FIG. 4D. FIG. 6E, FIG. 6F and FIG. 6G, on the other hand, show a transfer step, a fixing step and an erasure step, respectively, different from those in the Embodiment 1. Specifically, the transfer, the fixing and the erasure are carried out at separate steps. The erasure is achieved as the thermosensitive belt 14 is passed between a roller 64 and a whole-surface heating member 65, which uniformly heats the entire width of the thermosensitive belt 14 to a temperature above Th. The sequence of operations for each step is illustrated in FIG. 7, in which the dotted line indicates the sequence of the steps followed by the photosensitive drum 11, the chain line indicates the sequence of the steps followed by the thermosensitive belt 14, and the phantom line indicates the sequence of the steps followed by the recording paper 20.

The advantages discussed in connection with the Embodiment 1, except those derived from the simultaneous transfer, fixing and erasure, are also obtained with this Embodiment 2.

EMBODIMENT 3

Figure 8:
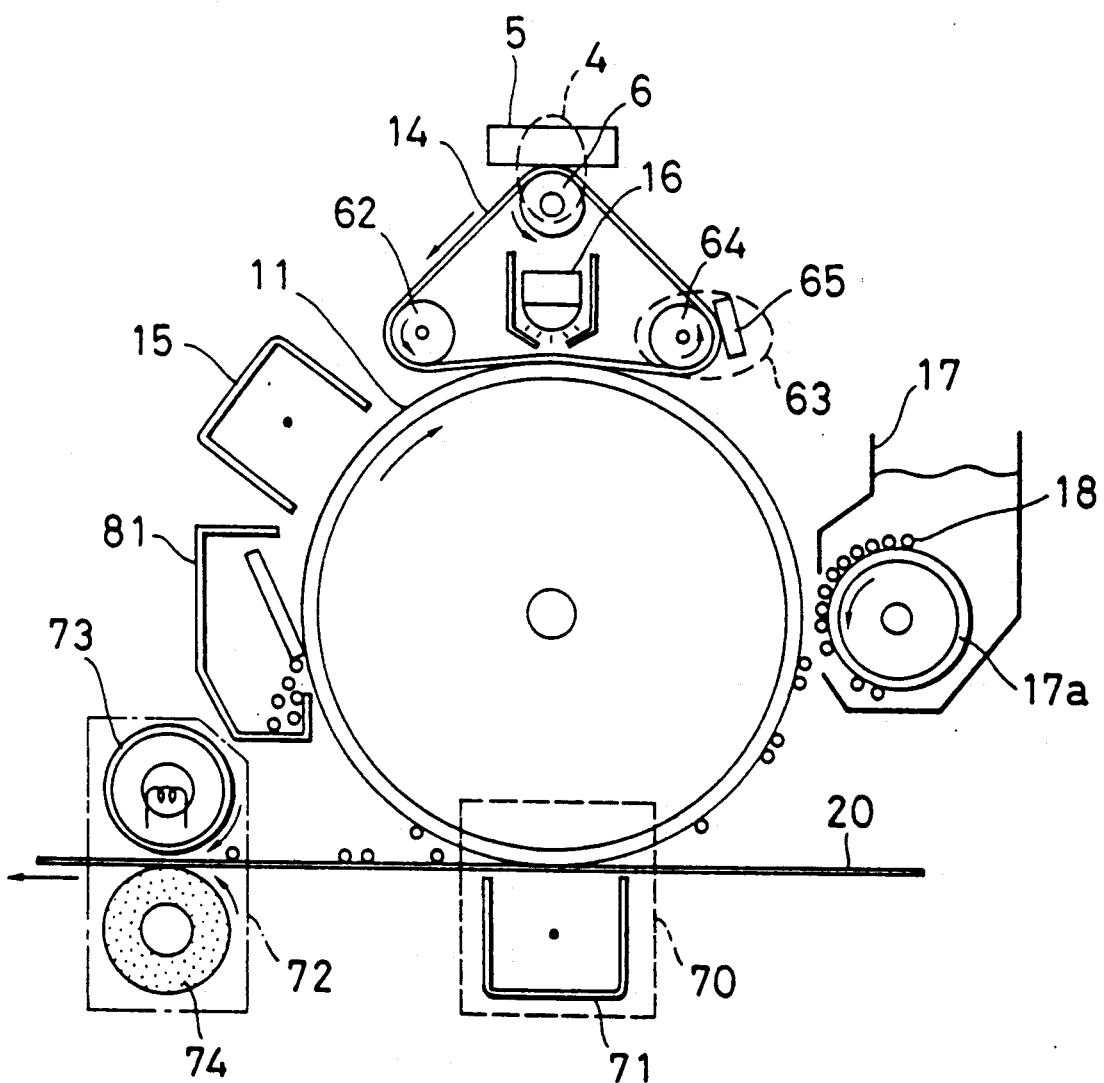
FIG. 8 is a schematic diagram of the image-forming apparatus of an Embodiment 3.

Another embodiment of the invention will now be described with reference to FIG. 8 to FIG. 10. In these drawings, reference numerals identical to those in FIG. 3 to FIG. 7 denote identical or similar devices or elements and their description is omitted.

In this Embodiment 3, the transfer of toner image, the fixing of the toner image and the erasure of the transmittance image are conducted at separate locations, like the Embodiment 2, and in addition, the development of the toner image is conducted on the photosensitive drum 11 rather than on the thermosensitive belt 14.

More specifically, the thermosensitive belt 14 is passed through a thermal writing section 4 formed of the thermal head 5 and a platen roller 6 which are urged toward each other. Belt 14 also passes around a free roller 62 and through an erasure section 63 formed of another free roller 64 and a whole-surface heating member 65. The thermosensitive belt 14 is brought into contact with photosensitive drum 11 at a location between the corona charger 15 and the exposure section 16, and is separated from the photosensitive drum 11 at a location between the exposure section 16 and the developing section 17.

The developing means 17 is installed facing the photosensitive drum 11 to develop toner images on the photosensitive drum 11 rather than on the thermosensitive belt 14 as in the Embodiment 1.

The recording paper 20, which is supplied by a feeding means similar to that of Embodiment 1, is passed through a transfer section 70, and then a fixing section 72.

A corona charger 71 constitutes the transfer section 70 for transferring toner images from the photosensitive drum 11 to the recording paper 20.

A fixing section 72 is formed of a heating roller 73 and a pressure roller 74 and fixes the toner image on the recording paper 20. The heating roller 73 may consist of a hollow metal member containing a halogen lamp or one having a heating body disposed directly on a metal surface.

The fixing section may alternatively comprise a pressure fixing device where the toner is a microcapsule pressure fixing toner, as is described above.

A cleaning means 81 is installed to remove any remaining toner on the photosensitive drum 11 after the transfer step. Instead of the blade cleaning device shown in the figure, any known technique in the prior art may be used.

A controller similar to the controller 30 in FIG. 2 is also provided, but it is omitted from illustration.

The action and function of this device will now be described.

The photosensitive drum 11 and the platen roller 6 are rotated at a fixed peripheral speed in the direction indicated by arrows, by a drive means not shown in the figure. Specifically, the platen roller 6 is driven such that the thermosensitive belt 14 rotates in the direction shown by the arrow and at the same speed as the peripheral speed of the photosensitive drum 11. A reversible thermosensitive belt 14 is passed around the platen roller 6 and the free rollers 62 and 64 such that it is in contact with the photosensitive drum 11, and due to friction with the platen roller 6, the thermosensitive belt 14 moves in the direction indicated by an arrow in the figure.

Initially, the photosensitive drum 11 is charged uniformly by the corona charger 15, while at the same time, a transmittance image is thermally written on the thermosensitive belt 14 by the thermal writing section 4.

Next, the reversible thermosensitive belt 14 on which a transmittance image has been formed is closely superimposed on the photosensitive drum 11, and the whole surface is irradiated by a whole-surface exposure means 16 through the thermosensitive belt 14.

In the developing process, electric lines of force are generated in the space between the developing roller 17a and the discharged areas of the photosensitive drum 11, and toner is moved along the electric lines of force and attracted toward the discharged areas and attached there to form a toner image on the photosensitive drum 11.

In the transfer process, the recording paper 20 is supplied and passes between the photosensitive drum 11 and the corona charger 71. The recording paper 20 is then superimposed on the photosensitive drum 11, with its first surface brought into contact with the surface of the photosensitive drum 11, and the toner image formed on photosensitive drum 11 is transferred electrostatically to the recording paper 20. In the example under consideration, the toner image has a positive polarity, and the corona charger 71 charges the second surface of the recording paper 20 with a negative polarity, so that the toner image on the photosensitive drum 11 is transferred electrostatically to the recording paper 20 (FIG. 9E).

In the fixing process, the toner image formed on the recording paper 20 is melted by the heat of the heating roller 73. The molten toner permeates the fibers of recording paper 20 due to the pressure of heating roller 73 and the pressure roller 74, and is thereby fixed. The recording paper 20 is then transported to the outside of the apparatus.

On the other hand, the thermosensitive belt 14, having passed the exposure section 16, reaches the erasure section 63. Here it is heated to a temperature above Th by the heat of the whole-surface heating member 65, and all the pixels across its width return to the original translucent state C (FIG. 2) when they are thereafter cooled to room temperature Te. The transmittance image on the thermosensitive belt 14 is thereby erased, and the thermosensitive belt is ready for the next cycle of operations.

Also, any toner remaining on the photosensitive drum 11 after the transfer process is collected and removed by a cleaning device 81, and the cleaned part of the photosensitive drum 11 is now ready for the next cycle of operations.

Although not shown, a discharge lamp similar to the one 26 shown in FIG. 3 may also be installed to remove charge remaining on the photosensitive drum 11. In this way, therefore, the photosensitive drum may be used again.

The image-forming process will now be described with reference to FIG. 9A to 9G.

The operations at the respective steps are as shown in FIG. 9A to FIG. 9E, 9G, in which FIG. 9A to FIG. 9C, FIG. 9F, and FIG. 9G respectively show a thermal writing step, a charging step, an exposure step, a fixing step, and an erasure step similar to those shown in FIG. 6A to FIG. 6C, FIG. 6F, and FIG. 6G. FIG. 9D and FIG. 9E on the other hand show the development step, the transfer step, and the fixing step which are different from those in FIG. 6D and FIG. 6E, respectively.

The difference is that the development is made on the photosensitive drum 11 in FIG. 9D rather than on the thermosensitive belt 14, and that the transfer in FIG. 9E is made from the photosensitive drum 11, rather than from the thermosensitive belt 14, to the recording paper 20.

Figure 10:
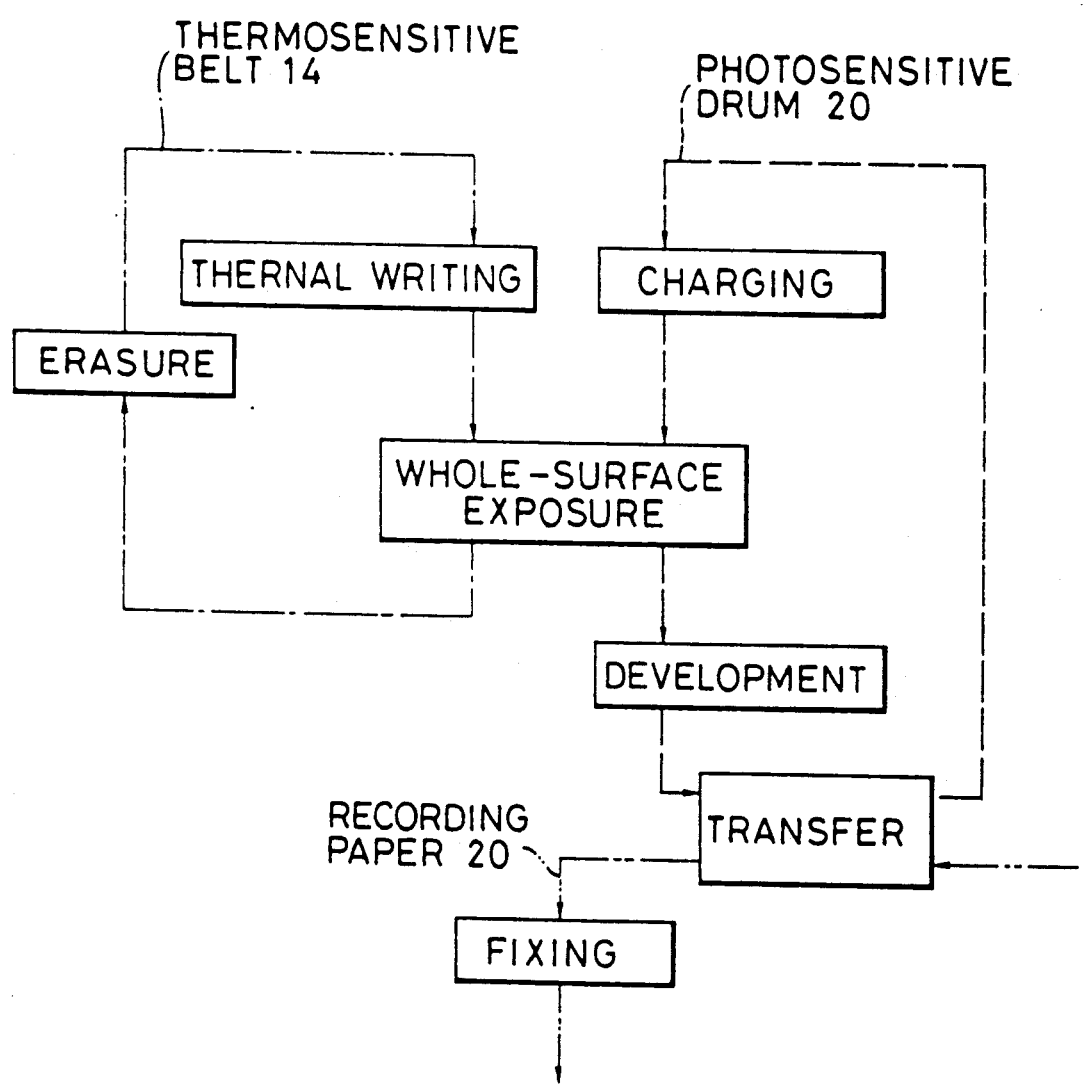
FIG. 10 shows the sequence of operations for each component in the Embodiment 3.

The sequence of operation for each step is illustrated in FIG. 10, in which the dotted line indicates the sequence of the steps followed by the photosensitive drum 11, the chain line indicates the sequence of the steps followed by the thermosensitive belt 14, and the phantom line indicates the sequence of the steps followed by the recording paper 20.

With the configuration of the Embodiment 3 described above, advantages similar to those provided by the Embodiment 2 are also attained.

This invention is not limited to the above embodiments, and various modifications which are possible within the scope and spirit of the invention shall not be excluded from it.

What is claimed is:

1. An image forming apparatus comprising:

charging means;

exposure means;

a photosensitive member having a surface moving to pass by said charging means and said exposure means;

said charging means uniformly charging the surface of said photosensitive member as it passes by said charging means;

thermal writing means;

a reversible thermosensitive medium, said thermosensitive medium passing by said thermal writing means and then said exposure means;

means for superimposing said thermosensitive medium with said photosensitive member when said thermosensitive medium passes by said exposure means;

said thermal writing means selectively applying heat to said thermosensitive medium to form a transmittance image represented by different transmittances;

said exposure means exposing the uniformly charged photosensitive member through said thermosensitive medium on which said transmittance image has been formed, to form an electrostatic image on said photosensitive member, said electrostatic image corresponding to said transmittance image;

developing means for forming a toner image corresponding to said electrostatic image; and transfer means for transferring said toner image onto a recording medium, wherein said developing means is disposed to confront said thermosensitive medium being superimposed on said photosensitive member, to form said toner image on said thermosensitive medium, and wherein said transfer means transfers said toner image from said thermosensitive medium.

2. The apparatus according to claim 1, wherein said exposure means comprises a light source of a uniform intensity across the width of the area of said photosensitive member in which said electrostatic image is to be formed.

3. The apparatus according to claim 1, further comprising a fixing means for fixing the toner image on the recording medium.

4. The apparatus according to claim 3, wherein said transfer means and said fixing means are integrated with each other to perform said transfer and said fixing simultaneously;

said photosensitive member is a cylindrical drum, said transfer means and said fixing means comprise a first roller and a second roller;

said reversible thermosensitive medium is in the form of an endless belt and passed around at least said photosensitive drum and said first roller;

said apparatus further comprising means for feeding said recording medium between said first and second rollers such that said recording medium is superimposed with said thermosensitive medium; and said first and second rollers press said recording medium and said thermosensitive medium when they are passed between said first roller and said second roller.

5. The apparatus according to claim 4, wherein at least one of said first and second rollers is a heating roller, the toner used in the developing means is a heat fixing toner, and said thermosensitive medium on which said toner image has been formed and the recording medium are heated and brought into pressure contact by said first and second rollers.

6. The apparatus according to claim 4, wherein the toner used in the developing means is a pressure fixing toner.

7. The apparatus according to claim 1, further comprising fixing means for fixing the toner image on the recording medium, wherein said thermosensitive medium has such hysteresis characteristics between temperature and transmittance that it assumes a first state when it is cooled to a first temperature after being heated to a second temperature higher than said first temperature, and assumes a second state when it is cooled to said a first temperature after being heated to a third temperature higher than said first temperature and lower than said second temperature, said thermal writing means selectively heats the areas of said thermosensitive medium to said third temperature;

said apparatus further comprising:

erasure means for heating the thermosensitive medium having passed the exposure means to said second temperature to erase the transmittance image.

8. An image forming apparatus comprising:

charging means;

exposure means;

a photosensitive member having a surface moving to pass by said charging means and said exposure means;

said charging means uniformly charging the surface of said photosensitive member as it passes by said charging means;

thermal writing means;

a reversible thermosensitive medium, said thermosensitive medium passing by said thermal writing means and then said exposure means, said thermosensitive medium having such hysteresis characteristics between temperature and transmittance that it assumes a first state when it is cooled to a first temperature after being heated to a second temperature higher than said first temperature, and assumes a second state when it is cooled to said first temperature after being heated to a third temperature higher than said first temperature and lower than said second temperature;

means for superimposing said thermosensitive medium with said photosensitive member when said thermosensitive medium passes by said exposure means;

said thermal writing means selectively applying heat to said thermosensitive medium to form a transmittance image represented by different transmittances, said thermal writing means selectively heating the areas of said thermosensitive medium to said third temperature;

said exposure means exposing the uniformly charged photosensitive member through said thermosensitive medium on which said transmittance image has been formed, to form an electrostatic image on said photosensitive member, said electrostatic image corresponding to said transmittance image;

erasure means for heating the thermosensitive medium having passed the exposure means to said second temperature to erase the transmittance image;

developing means for forming a toner image corresponding to said electrostatic image;

said developing means being disposed to confront said thermosensitive medium being superimposed on said photosensitive member to form said toner image on said thermosensitive medium, transfer means for transferring said toner image onto a recording medium; and said transfer means transferring said toner image from said thermosensitive body to said recording medium.

9. The apparatus according to claim 8, further comprising fixing means for fixing the toner image on the recording medium.

10. The apparatus according to claim 9, wherein said transfer means, said fixing means and said erasure means are integrated with each other to perform said transfer and said fixing simultaneously.

11. The apparatus according to claim 10, wherein said transfer means, said fixing means and said erasure means comprise a combination of a heating roller and a pressure roller pressed against each other.

12. An image-forming apparatus, comprising:
a drum having a photosensitive surface, the drum being mounted for rotation;
charging means for uniformly changing the surface of the drum;
a belt bearing a reversible thermosensitive medium, the belt having an inner surface and an outer surface;
mounting means for mounting the belt so that the belt is movable along a closed path enclosing the drum and so that the outer surface of the belt does not contact the surface of the drum, the inner surface of the belt contacting the surface of the drum during a portion of the path;
a thermal writing head disposed along the path to form a transmittance image on the belt by selectively applying heat to the thermosensitive medium;
exposure means for forming an electrostatic image on the photosensitive surface of the drum corresponding to the transmittance image on the belt, the exposure means including a light-emitting device which is disposed adjacent the portion of the path where the inner surface of the belt contacts the surface of the drum and which exposes the surface of the drum through the belt;
developing means for forming a toner image corresponding to the electrostatic image on the outer surface of the belt; and
means for transferring the toner image to a recording medium.

13. The apparatus according to claim 12, further comprising fixing means for fixing the toner image on the recording medium.

14. The apparatus according to claim 13, wherein said means for transferring and said fixing means are integrated with each other to perform the transfer and fixing simultaneously.

* * * * *